(12) United States Patent
Fenton et al.

(10) Patent No.: US 10,768,203 B2
(45) Date of Patent: Sep. 8, 2020

(54) END EFFECTOR ATTACHMENT FOR TESTING ELECTRONIC TOUCHSCREEN DEVICE

(71) Applicant: Walmart Apollo, LLC, Bentonville, AR (US)

(72) Inventors: Timothy M. Fenton, Bentonville, AR (US); Christopher D. Johnson, Bentonville, AR (US); Joel E. Strader, Bella Vista, AR (US)

(73) Assignee: Walmart Apollo, LLC, Bentonville, AR (US)

( * ) Notice: Subject to any disclaimer, the term of this patent is extended or adjusted under 35 U.S.C. 154(b) by 165 days.

(21) Appl. No.: 15/852,281

(22) Filed: Dec. 22, 2017

(65) Prior Publication Data
US 2018/0180645 A1  Jun. 28, 2018

Related U.S. Application Data

(60) Provisional application No. 62/437,904, filed on Dec. 22, 2016.

(51) Int. Cl.
*G01R 1/067* (2006.01)
*G06F 11/22* (2006.01)
(Continued)

(52) U.S. Cl.
CPC ........ *G01R 1/06711* (2013.01); *G01R 1/0425* (2013.01); *G01R 31/2825* (2013.01);
(Continued)

(58) Field of Classification Search
CPC .............. G01R 1/0425; G01R 1/06711; G01R 31/2825; G01R 31/18; G01R 1/07307;
(Continued)

(56) References Cited

U.S. PATENT DOCUMENTS 4,330,165 A * 5/1982 Sado ................... H01R 12/714
439/91
6,051,982 A * 4/2000 Alcoe ................ G01R 1/06733
324/750.16
(Continued)

FOREIGN PATENT DOCUMENTS

WO   2015200025   12/2015

OTHER PUBLICATIONS

"How can a capacitive touch screen be triggered without human contact'?"; Electrical Engineering Stack Exchange; http://electronics.stackexchange.com/questions/23036/howcanacapacitivetouchscreenbetriggeredwithouthumancontact; pp. 1-2.
(Continued)

*Primary Examiner* — Tung X Nguyen
*Assistant Examiner* — Robert P Alejnikov, Jr.
(74) *Attorney, Agent, or Firm* — Fitch, Even, Tabin & Flannery LLP

(57) ABSTRACT

In some embodiments, apparatuses and methods are provided herein useful for testing a touchscreen electronic device. In some embodiments, an attachment for an end effector for use with testing a touchscreen electronic device comprises a body, wherein the body includes a connection portion configured to secure the attachment to the end effector, a first end, an opening, wherein the opening is located adjacent to the first end, and a conductive contact member, wherein the conductive contact member is wrapped about the first end, and wherein the conductive contact member is configured to contact the touchscreen during testing and simulate a touch of a human finger.

22 Claims, 5 Drawing Sheets

(51) Int. Cl.
  *G01R 1/04* (2006.01)
  *G01R 31/28* (2006.01)
  *G06F 3/044* (2006.01)

(52) U.S. Cl.
  CPC .......... *G06F 11/2221* (2013.01); *G06F 3/044* (2013.01); *Y02P 90/02* (2015.11)

(58) Field of Classification Search
  CPC .............. G01R 1/07342; G01R 1/0466; G01R 1/06705; G01R 1/06794; G01R 1/07314; G01R 1/07364; G01R 31/01; G01R 31/028; G01R 31/2863; G01R 31/2889; G01R 31/2891; G06F 11/2221; G06F 3/044; Y02P 90/02
  USPC ........... 324/511, 690, 754.03, 754.1, 755.01, 324/755.1, 755.11
  See application file for complete search history.

(56) References Cited

U.S. PATENT DOCUMENTS

| | | | | |
|---|---|---|---|---|
| 7,677,901 | B1 * | 3/2010 | Suzuki | G01R 1/0466 |
| | | | | 439/66 |
| 8,988,087 | B2 | 3/2015 | Uzelac | |
| 8,996,166 | B2 | 3/2015 | Jenkinson | |
| 9,092,077 | B2 | 7/2015 | Boyd | |
| 9,481,084 | B2 * | 11/2016 | Park | B25J 9/1612 |
| 2008/0297493 | A1 * | 12/2008 | Adkins | G06F 3/03545 |
| | | | | 345/179 |
| 2012/0187956 | A1 * | 7/2012 | Uzelac | G01R 31/28 |
| | | | | 324/537 |
| 2012/0194171 | A1 * | 8/2012 | Blakely | G01R 15/185 |
| | | | | 324/117 R |
| 2012/0280934 | A1 * | 11/2012 | Ha | G06F 11/2221 |
| | | | | 345/174 |
| 2013/0021292 | A1 * | 1/2013 | Tatelbaum | G06F 3/044 |
| | | | | 345/174 |
| 2013/0345864 | A1 | 12/2013 | Park | |
| 2014/0111484 | A1 * | 4/2014 | Welch | H04N 17/00 |
| | | | | 345/178 |
| 2014/0309775 | A1 * | 10/2014 | Jenkinson | G06F 3/0418 |
| | | | | 700/250 |
| 2016/0089792 | A1 * | 3/2016 | Ojalehto | B25J 15/0441 |
| | | | | 73/865.6 |
| 2016/0154507 | A1 | 6/2016 | Bharathan | |

OTHER PUBLICATIONS

PCT; App. No. PCT/US2017/067207; International Search Report and Written Opinion dated Feb. 22, 2018.
Sastra; "Automated Real Device Testing"; Sastra Robotics; http://www.sastrarobotics.com/solutions/; pp. 1-2.
Simonite, Tom; "Intel Robot Puts Touch Screens through Their Paces"; https://www.technologyreview.com/s/522501/intelrobotputstouchscreensthroughtheirpaces/; published Dec. 19, 2013; pp. 1-6.
Szczys, Mike; "Shakey robot plays Angry Birds"; Hackaday; http://hackaday.com/2012/07/24/shakeyrobotplaysangrybirds/; published Jul. 24, 2012; pp. 1-7.
Toh, Yue Peng; "Sticky-Finger Manipulation With a Multi-Touch Interface"; Carnegie Mellon University; http://www.cs.cmu.edu/~ytoh/stickyfingers.pdf; published Jul. 2011; pp. 1-52.

* cited by examiner

END EFFECTOR ATTACHMENT FOR TESTING ELECTRONIC TOUCHSCREEN DEVICE

CROSS-REFERENCE TO RELATED APPLICATION

This application claims the benefit of U.S. Provisional Application No. 62/437,904, filed Dec. 22, 2016, which is incorporated by reference in its entirety herein.

TECHNICAL FIELD

This invention relates generally to robotic testing equipment and, more specifically, to end effector attachments.

BACKGROUND

Capacitive touchscreens sense touch when current is able to flow from the touchscreen. When a person interacts with a capacitive touchscreen, current flows from the touchscreen (higher potential) to the person (lower potential) via the person's finger. Because capacitive touchscreens sense touch when current flows from the touchscreen, specialized equipment is used to test capacitive touchscreens. For example, robots that include conductive portions, such as conductive rubber tips, are used to test capacitive touchscreen devices. Although conductive rubber tips allow a robot to test a capacitive touchscreen, the conductive rubber tips are susceptible to damage during testing. Specifically, as the robot repetitively contacts the touchscreen with the rubber tip, the rubber tip cracks and breaks over time, rendering the rubber tip unusable. When a rubber tip becomes unusable, it must be replaced, increasing the time, and cost, required to test conductive touchscreen devices.

BRIEF DESCRIPTION OF THE DRAWINGS

Disclosed herein are embodiments of systems, apparatuses and methods pertaining to an attachment for testing a touchscreen. This description includes drawings, wherein.

Figure 1:
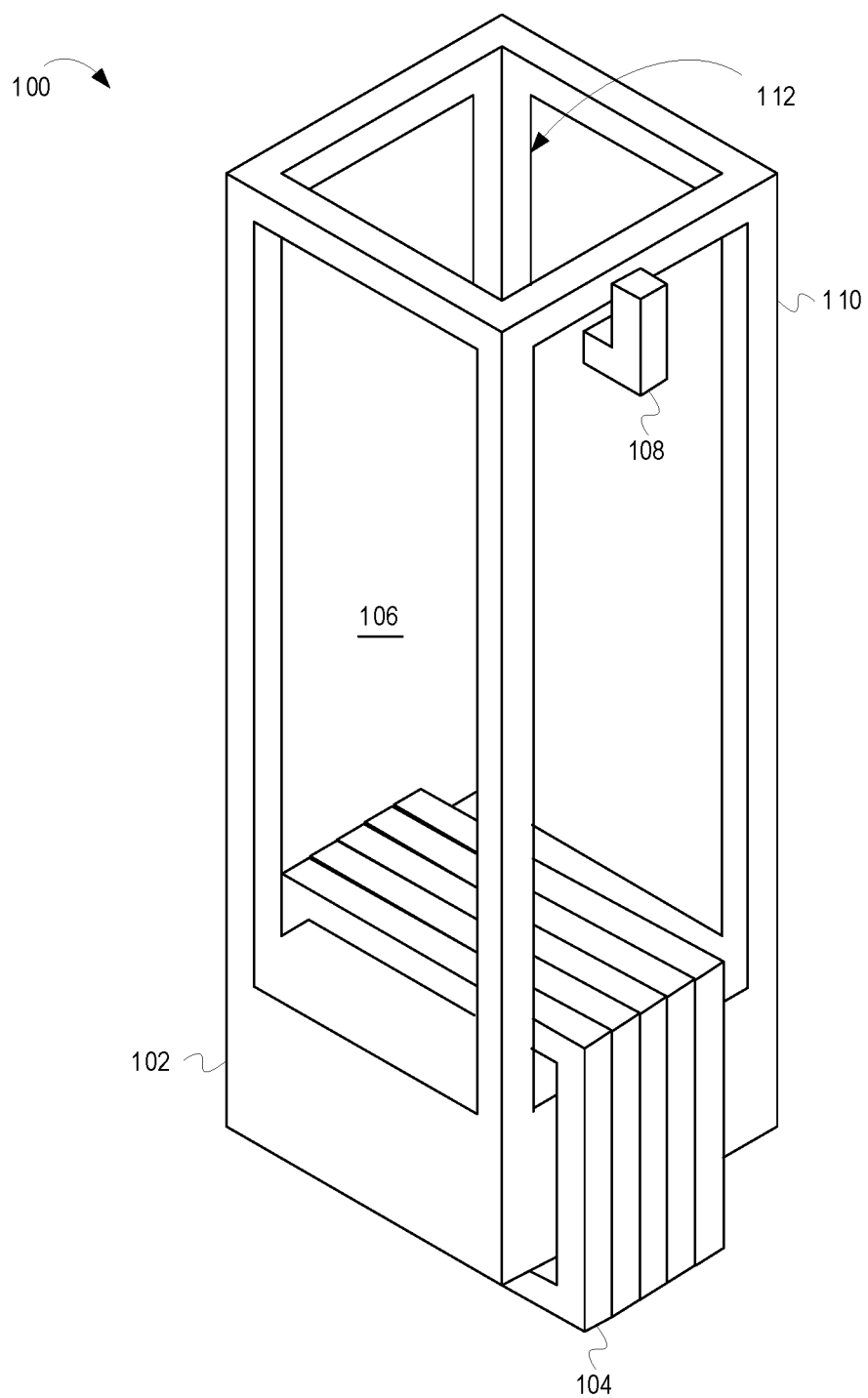
FIG. 1 is an isometric view of an attachment 100 for an end effector for use with testing an electronic touchscreen device including a conductive linear member 104, according to some embodiments.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, pursuant to various embodiments, systems, apparatuses and methods are provided herein useful for testing a touchscreen electronic device. In some embodiments, an attachment for an end effector for use with testing a touchscreen electronic device comprises a body, wherein the body includes a connection portion configured to secure the attachment to the end effector, a first end, an opening, wherein the opening is located adjacent to the first end, and a conductive contact member, wherein the conductive contact member is wrapped about the first end, and wherein the conductive contact member is configured to contact the touchscreen during testing and simulate a touch of a human finger.

As previously discussed, for a capacitive touchscreen to detect touch, current must flow from the touchscreen. Because current must flow for the touchscreen to detect touch, equipment (e.g., robot) used to test capacitive touchscreen devices typically includes a conductive portion. The conductive portion allows current to flow from the touchscreen to the equipment. Oftentimes, the conductive portion is a tip made of conductive rubber and affixed to the robot (e.g., attached to an end effector of the robot). The conductive rubber tip allows current to flow from the touchscreen to the robot. Unfortunately, the tips made of conductive rubber are not resilient and are prone to breakage.

Robots typically have operational tolerances. For example, a robot may only be able to move with an accuracy of +/−1 cm. Additionally, robots are typically unable to sense fine feedback. Programmers compensate for the robot's lack of precision and ability to sense fine feedback forces by programming the robot in such a manner that the robot is guaranteed to make contact with the touchscreen (e.g., if the touchscreen is 10 cm from the robot and the robot's operational tolerance is +/−7-1 cm, the programmer will program the robot to move 11 cm to ensure contact with the touchscreen). Such compensation often results in forceful contact between the robot and the touchscreen (i.e., contact with a greater force than required). Put simply, it is difficult to achieve gentle contact with a robot. This forceful contact increases the rate at which the tips are damaged and broken and in some instances, can result in damage to the touchscreen. Additionally, the tips are subject to damage when used to write, for example, a signature, on the touchscreen.

When a tip is damaged or broken, it can become unusable, requiring replacement of the tip. Such replacement introduces downtime into the testing routine and increases the cost of testing. Consequently, a need exists for an improved device for testing capacitive touchscreen devices, as well as any other devices that benefit from being contacted with a conductive device.

Embodiments described herein seek to solve, or at least decrease, the problems associated with current touchscreen testing devices via an end effector including a conductive contact member (e.g., a conductive linear member, conductive fabric, etc.) that is wrapped about an end of the attachment. The attachment is secured to an end effector of a robot. When the robot contacts the touchscreen via the attachment, current flows from the touchscreen through the conductive contact member. This flow of current allows the touchscreen to detect the touch (i.e., the contact between the attachment and the touchscreen). Additionally, the conductive contact member is more resilient than a conductive rubber tip. Because the conductive contact member is more resilient than a conductive rubber tip, the conductive contact member is less prone to damage and/or breakage, requiring less frequent, if any, replacement. For example, a conductive rubber tip may only withstand a few days of testing (e.g., 400 to 600 contacts with a touchscreen, while a conductive contact member as described herein may withstand several months (in the case of a conductive linear member) or years (in the case of a conductive fabric) of testing. This can reduce the time required for testing, as well as the costs associated with testing (e.g., costs incurred as a result of replacement parts and downtime). The systems, methods, and apparatuses described herein can be used with automated testing systems, such as those described in U.S. Provisional Patent Application No. 62/438,506, incorporated herein by reference.

The discussion of FIGS. 1, 2A, 2B, 4, and 5 describe attachments having different conductive contact members. Specifically, the attachment described with respect to FIGS. 1, 2A, and 2B includes a conductive contact portion that is a conductive linear member. The attachment described with respect to FIGS. 4-5 include a conductive contact portion that is a conductive fabric.

FIG. 1 is an isometric view of an attachment 100 for an end effector for use with testing an electronic touchscreen device including a conductive linear member 104, according to some embodiments. The attachment 100 comprises a body 110. The body 110 can be constructed of any suitable material, such as plastic, metal, rubber, a composite material, etc., or any combination of these materials.

The body 110 features a first end 102 and an opening 106 that is adjacent to the first end 102. The opening 106 permits a conductive linear member 104 to be wrapped about the first end 102 and through the opening 106, as depicted in FIG. 1. While the attachment 100 depicted in FIG. 1 includes an opening 106 that is quite large relative to the size of the attachment 100, any size opening 106 can be used so long as the conductive linear member 104 is capable of being passed through the opening. Additionally, although the attachment 100 depicted in FIG. 1 includes an opening on all sides of the attachment 100, such a configuration is not required (e.g., only the opposing sides may be open while the sides adjacent to the open sides are covered). The conductive linear member 104 can be made from any suitable material (i.e., any material that is conductive and capable of being wrapped about the first end 102 and through the opening 106). For example, the conductive linear member 104 can be conductive thread, conductive twine, conductive ribbon, etc. The conductive linear member 104 can have any suitable conductivity, for example, as low as 0.001 Ohm/cm or less. Preferably however, the conductive linear member 104 will have a conductivity of approximately 0.008 Ohm/cm or higher. The conductive linear member 104 is resilient and capable of deformation while resisting cracking, damage, and breakage.

The attachment 100 also includes a connection portion 112. The connection portion 112 is configured to secure the attachment 100 to the end effector. The connection portion 112 can take any suitable form. As one example, the connection portion 112 of the attachment 100 depicted in FIG. 1 includes an open area through which the end effector can pass, allowing the end effector to be at least partially inserted within the attachment 100.

In some embodiments, the attachment 100 can also include a securement mechanism 108. The securement mechanism 108 is configured to releasably secure the attachment 100 to the end effector. The securement mechanism 108 can be any device suitable to releasably secure the attachment 100 to the end effector. For example, the securement mechanism 108 can be a clip, detent, clasp, raised portion, a groove, a button, etc.

In use, the attachment 100 is secured to (i.e., used in concert with) an end effector of a robot to test a touchscreen (i.e., a touchscreen electronic device). The robot contacts the touchscreen with the attachment 100. Specifically, the conductive linear member 104 contacts the touchscreen. Because the conductive linear member 104 is capable of conducting electricity (i.e., allowing current to flow), the touchscreen can detect the touch of the attachment 100. Consequently, the attachment 100 can simulate the touch of a human finger.

Figure 2A:
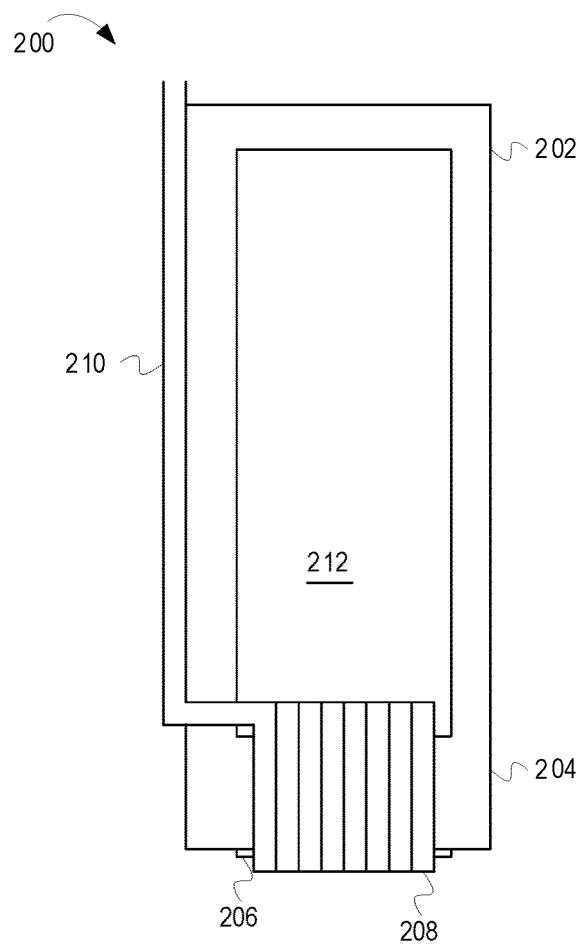
FIGS. 2A and 2B depict a side view and a bottom view, respectively, of an attachment for an end effector for use with testing an electronic touchscreen device including a conductive linear member 208, according to some embodiments.
Figure 2B:
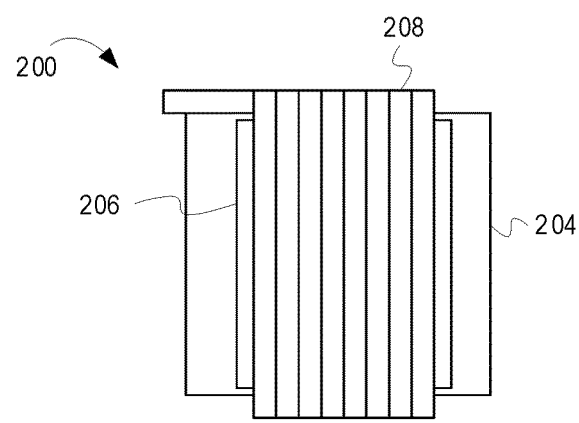

While the discussion of FIG. 1 provides an overview of an attachment including a conductive linear member for use with testing a touchscreen, the discussion of FIGS. 2A and 2B provide additional detail regarding such an attachment.

FIGS. 2A and 2B depict a side view and a bottom view, respectively, of an attachment for an end effector for use with testing an electronic touchscreen device including a conductive linear member 208, according to some embodiments. The attachment 200 comprises a body 202. The body includes a first end 204 and an opening 212. The opening 212 is adjacent to the first end. The opening 212 is sized and arranged such that a conductive linear member 208 can be wrapped about the first end 204 and through the opening 212. The attachment 200 also includes a connection portion configured to secure the attachment to the end effector. When attached to the end effector, a robot can contact a touchscreen via the attachment 200 to simulate the touch of a human finger.

The attachment 200 allows the robot to interact with the touchscreen because the conductive linear member 208 allows current to flow from the touchscreen to the attachment 200. In some embodiments, the conductive linear member 208 is conductively coupled to a conductive portion 210 of the attachment 200. The conductive portion 210 can be part of the conductive linear member 208 (as shown in FIG. 2). The conductive portion is conductively coupled to the end effector providing a conductive path to the robot (e.g., a body portion of the robot).

To further increase the resilience of the conductive linear member 208, in some embodiments, the attachment 200 includes a resilient portion 206. The resilient portion is located beneath the conductive linear member 208 (i.e., between the conductive linear member 208 and the first end 204). The resilient portion 206 provides extra damping for the conductive linear member 208. The resilient portion 206 can comprise any suitable material. For example, the resilient portion 206 can be rubber, plastic, fabric, etc. Different touchscreens may have differing actuation forces (i.e., the amount of force required for a touch to be registered). The type and/or properties of the resilient portion 206 can be adjusted based on the actuation force of the touchscreen being tested. For example, if the touchscreen being tested has a large actuation force (e.g., 10 N), a resilient portion 206 having substantial damping can be used to better protect the touchscreen and prevent damage to the conductive linear member 208. Alternatively, if the touchscreen has a low actuation force (e.g., 1 N), the attachment 200 may not require the resilient portion 206.

Figure 3:
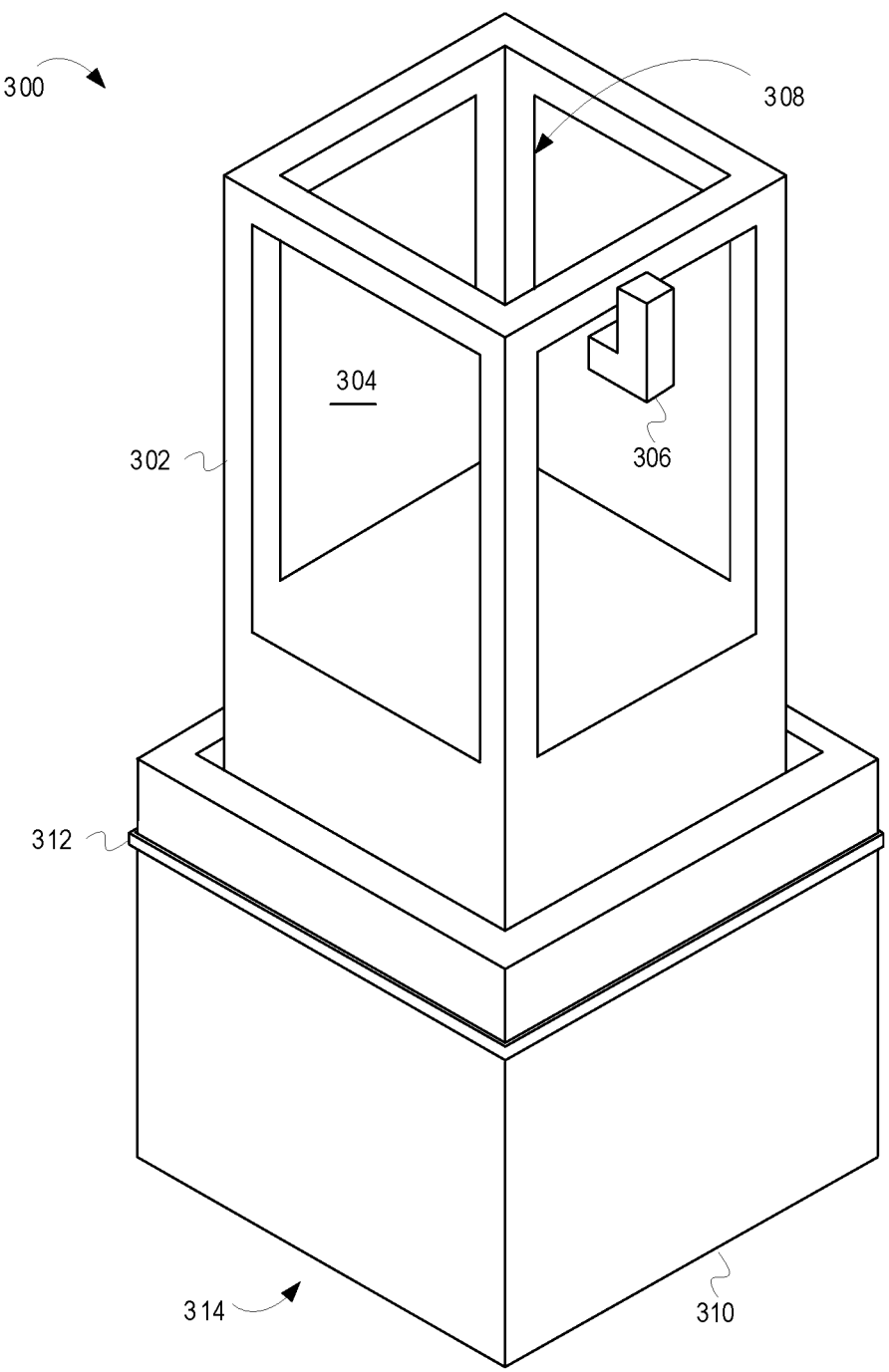
FIG. 3 is an isometric view of an attachment 300 for an end effector for use with testing an electronic touchscreen device including a conductive fabric 310 and a conductive portion 312, according to some embodiments.
Figure 4:
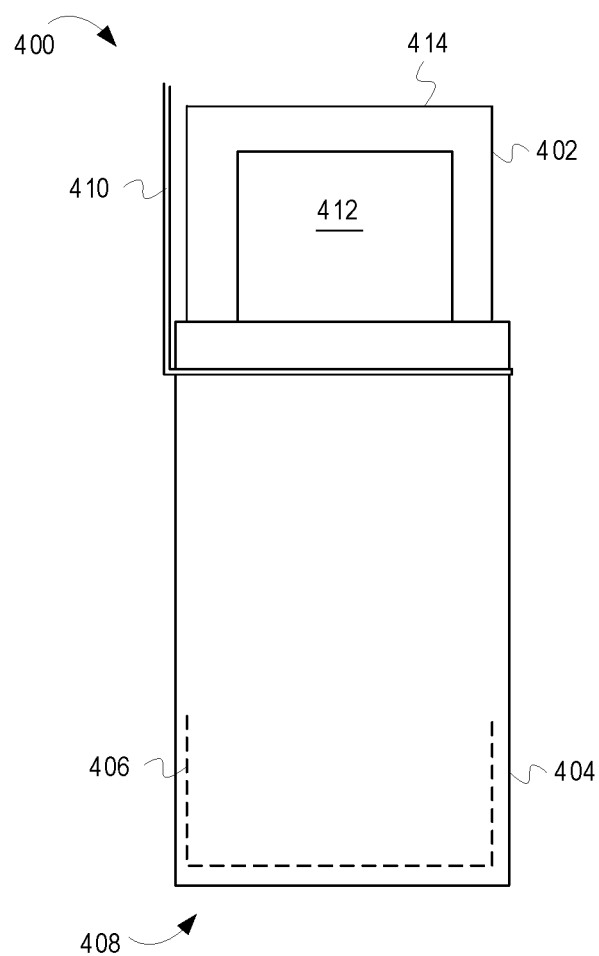
FIG. 4 depicts a side view of an attachment 400 for an end effector for use with testing an electronic touchscreen device including a conductive fabric 504 and a conductive portion 410.

While the discussion of FIGS. 1, 2A, and 2B provides additional detail regarding an attachment including a conductive linear member for use with testing a touchscreen, the discussion of FIGS. 3 and 4 describe an attachment including a conductive fabric for use with testing a touchscreen.

FIG. 3 is an isometric view of an attachment 300 for an end effector for use with testing an electronic touchscreen device including a conductive fabric 310 and a conductive portion 312, according to some embodiments. The attachment 300 comprises a body 302. The body 302 can be constructed of any suitable material, such as plastic, metal, rubber, a composite material, etc., or any combination of these materials.

The body 302 includes a first end 314. A conductive fabric 310 is wrapped about the first end 314, as depicted in FIG. 3. Opposite the first end 314 is a connection portion 308. The connection portion 308 is configured to secure the attachment 300 to an end effector. The connection portion 308 can take any suitable form. As one example, the connection portion 308 of the attachment 300 depicted in FIG. 3 includes an open area 304 through which the end effector can pass, allowing the end effector to be at least partially inserted within the attachment 300.

In some embodiments, the attachment 300 can also include a securement mechanism 306. The securement mechanism 306 is configured to releasably secure the attachment 300 to the end effector. The securement mechanism 306 can be any device suitable to releasably secure the attachment 300 to the end effector. For example, the securement mechanism 306 can be a clip, detent, clasp, raised portion, a groove, a button, etc.

In use, the attachment 300 is secured to (i.e., used in concert with) an end effector of a robot to test a touchscreen (i.e., a touchscreen electronic device). The robot contacts the touchscreen with the attachment 300. Unlike the attachment described with respect to FIGS. 1, 2A, and 2B, the conductive fabric 314 contacts the touchscreen. In some embodiments, the conductive fabric 314 may be more resilient than a conductive linear member, and less likely to become damaged. In such embodiments, the conductive fabric 314 may need to replaced less frequently than a similar conductive linear member.

The attachment 300 allows the robot to interact with the touchscreen because the conductive fabric 310 allows current to flow from the touchscreen to the attachment 400. In some embodiments, the conductive fabric 310 is secured to the attachment 300 via a conductive portion 312. The conductive portion can be a conductive linear member, as described with respect to FIGS. 1, 2A, and 2B. As one example, the conductive portion 312 can be a conductive thread. In this example, the conductive thread is tied about the attachment 300 to secure the conductive fabric 310 to the attachment 300. In some embodiments, the conductive portion is coupled to the end effector providing a conductive path to the robot (as describer in more detail with respect to FIG. 4).

While the discussion of FIG. 3 provides an overview of an attachment including a conductive fabric for use with testing a touchscreen, the discussion of FIG. 4 provides additional detail regarding such an attachment.

FIG. 4 depicts a side view of an attachment 400 for an end effector for use with testing an electronic touchscreen device including a conductive fabric 404 and a conductive portion 410. The attachment 400 comprises a body 402. The body 402 includes a first end 408 and a second end 414. The second end 414 is configured to be connected to an end effector. In the example depicted in FIG. 4, the second end 414 of the attachment 400 includes an opening 412. The opening 412 is configured to receive an end effector. When attached to the end effector, a robot can contact a touchscreen via the attachment 400 and simulate the touch of a human finger.

The first end 408 is configured to receive the conductive fabric 404. The conductive fabric can be of any suitable type and is preferably pliable and resilient when subjected to deformation. In the example depicted in FIG. 4, the conductive fabric 404 is wrapped about the first end 408 of the attachment 400. In use, the conductive fabric 404 contacts the touchscreen. The conductive fabric 404 can be secured to the attachment 400 via any suitable means. For example, the conductive fabric 404 can be adhered to the attachment 400, pinned to the attachment 400, tied to the attachment 400, etc. In the example depicted in FIG. 4, the conductive fabric 404 is secured to the attachment 400 via the conductive portion 410. Specifically, the conductive fabric 404 is tied to the attachment with the conductive portion 410. In the example depicted in FIG. 4, in addition to securing the conductive fabric 404 to the attachment 400, the conductive portion 410 creates a conductive pathway from the touchscreen to the robot. That is, the conductive portion 410 is electrically coupled to the robot.

In some embodiments, the attachment 400 can also include a resilient portion 406. The resilient portion is located beneath the conductive fabric 404 (i.e., between the conductive fabric 404 and the first end 408 of the attachment 400). The resilient portion 406 provides extra damping for the conductive fabric 404. The resilient portion 406 can comprise any suitable material. For example, the resilient portion 406 can be rubber, plastic, fabric, etc. Different touchscreens may have differing actuation forces (i.e., the amount of force required for a touch to be registered). The type and/or properties of the resilient portion 406 can be adjusted based on the actuation force of the touchscreen being tested. For example, if the touchscreen being tested has a large actuation force (e.g., 10 N), a resilient portion 406 having substantial damping can be used to better protect the touchscreen and prevent damage to the conductive fabric 404. Alternatively, if the touchscreen has a low actuation force (e.g., 1 N), the attachment 400 may not require the resilient portion 406. The conductive fabric 404 can be attached to the resilient portion 406 using any suitable means.

Figure 5:
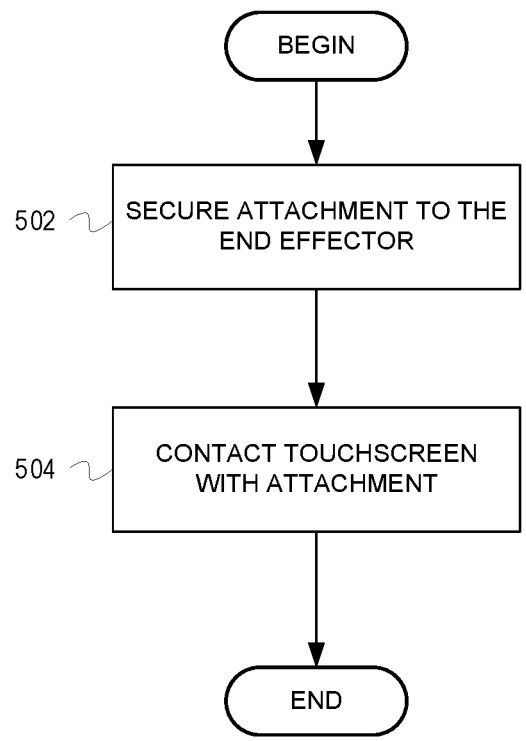
FIG. 5 is a flow diagram including example operations for testing an electronic touchscreen device with an attachment including a conductive linear member, according to some embodiments.

While the discussion of FIGS. 1-4 describe attachments having different conductive contact members, the discussion of FIG. 5 describes using an attachment having a conductive contact member to test an electronic touchscreen device.

FIG. 5 is a flow diagram including example operations for testing an electronic touchscreen device with an attachment including a conductive linear member, according to some embodiments. The flow begins at block 502.

At block 502, an attachment is secured to an end effector. The attachment includes a conductive linear portion and is used to test a touchscreen. The conductive linear member is wrapped about a first end of the attachment and through an opening adjacent to the attachment. The touchscreen can be of a type that requires conductive contact to detect touch (i.e., contact with the touchscreen). The conductive linear member provides a conductive path from the touchscreen to a source of lower potential, such as a robot body. The end effector is coupled to a robot that interacts with the touchscreen via the attachment to test the touchscreen. The flow continues at block 504.

At block 504, the touchscreen is contacted with the attachment. For example, the robot can contact the touchscreen with the attachment. Because the conductive linear member allows current to flow from the touchscreen, the robot can test the touchscreen by contacting the touchscreen with the attachment.

In some embodiments, an attachment for an end effector for use with testing a touchscreen electronic device comprises a body, wherein the body includes a connection portion configured to secure the attachment to the end effector, a first end, an opening, wherein the opening is located adjacent to the first end, and a conductive contact member, wherein the conductive contact member is wrapped about the first end, and wherein the conductive linear member is configured to contact the touchscreen during testing and simulate a touch of a human finger.

In some embodiments, an apparatus and a corresponding method performed by the apparatus comprises securing an attachment to an end effector, wherein the end effector comprises a body, wherein the body includes a connection portion configured to secure the attachment to the end effector, a first end, an opening, wherein the opening is located adjacent to the first end, and a conductive contact member, wherein the conductive contact member is wrapped about the first end, and contacting, with the conductive linear member, the touchscreen to simulate the touch of a human finger.

Those skilled in the art will recognize that a wide variety of other modifications, alterations, and combinations can also be made with respect to the above described embodiments without departing from the scope of the invention, and that such modifications, alterations, and combinations are to be viewed as being within the ambit of the inventive concept.

What is claimed is:

1. An attachment for an end effector for use with testing a touchscreen electronic device, the attachment comprising:
    a body, wherein the body includes a first end and a second end, wherein the first end is opposite the second end, and wherein the body comprises:
        a connection portion configured to secure the attachment to the end effector,
            wherein the connection portion is located adjacent to the second end;
        an opening, wherein the opening is located adjacent to the first end; and
        a conductive contact member, wherein the conductive contact member is wrapped about the first end and through the opening, and wherein the conductive contact member is configured to contact the touchscreen during testing and simulate a touch of a human finger.

2. The attachment of claim 1, wherein the conductive contact member is configured to provide a conductive path to a body portion of a robot to which the end effector is attached.

3. The attachment of claim 1, further comprising:
    a resilient portion, wherein the resilient portion is located between the first end and the conductive contact member.

4. The attachment of claim 3, wherein the resilient portion comprises rubber.

5. The attachment of claim 3, wherein the resilient portion is affixed to the first end.

6. The attachment of claim 1, wherein the connection portion allows the end effector to be at least partially inserted within the attachment.

7. The attachment of claim 1, further comprising:
    a securement mechanism configured to releasably secure the attachment to the end effector.

8. The attachment of claim 7, wherein the securement mechanism is one or more of a clip, detent, clasp, raised portion, groove, and button.

9. The attachment of claim 1, further comprising:
    a conductive portion, wherein the conductive contact member is conductively coupled to the conductive portion, and wherein the conductive portion is conductively coupled to at least a portion of the end effector when the attachment is secured to the end effector.

10. The attachment of claim 1, wherein the conductive contact member is one of a conductive linear member and a conductive fabric.

11. The attachment of claim 1, wherein the conductive contact member comprises a linear member, and wherein the conductive contact member is wrapped multiple times about the first end and through the opening.

12. A method for testing a touchscreen electronic device with an attachment for an end effector, the method comprising:
    securing the attachment to the end effector, wherein the attachment comprises:
        a body, wherein the body includes a first end and a second end, wherein the first end is opposite the second end, wherein the body comprises:
            a connection portion configured to secure the attachment to the end effector, wherein the connection portion is located adjacent to the second end;
            an opening, wherein the opening is located adjacent to the first end; and
            a conductive contact member, wherein the conductive contact member is wrapped about the first end and through the opening; and
    contacting, with the conductive contact member, the touchscreen to simulate a touch of a human finger.

13. The method of claim 12, wherein the conductive contact member is configured to provide a conductive path to a body portion of a robot to which the end effector is attached.

14. The method of claim 12, wherein the attachment further comprises a resilient portion, wherein the resilient portion is located between the first end and the conductive contact member.

15. The method of claim 14, wherein the resilient portion comprises rubber.

16. The method of claim 14, wherein the resilient portion is affixed to the first end.

17. The method of claim 12, wherein the connection portion allows the end effector to be at least partially inserted within the attachment.

18. The method of claim 12, wherein the attachment further comprises a securement mechanism configured to releasably secure the attachment to the end effector.

19. The method of claim 18, wherein the securement mechanism is one or more of a clip, detent, clasp, raised portion, groove, and button.

20. The method of claim 12, wherein the attachment further comprises a conductive portion, wherein the conductive contact member is conductively coupled to the conductive portion, and wherein the conductive portion is conductively coupled to at least a portion of the end effector when the attachment is secured to the end effector.

21. The method of claim 12, wherein the conductive contact member is one of a conductive linear member and a conductive fabric.

22. The method of claim 12, wherein the conductive contact member comprises a linear member, and wherein the conductive contact member is wrapped multiple times about the first end and through the opening.

* * * * *